United States Patent [19]
Taylor et al.

[11] Patent Number: 5,193,248
[45] Date of Patent: Mar. 16, 1993

[54] LATCHING ASSEMBLY FOR HINGEABLE PLATE MEMBERS

[75] Inventors: Peter Taylor, Pawtucket, R.I.; Victor Motyka, Attleboro, Mass.

[73] Assignee: Precision Art Coordinators, Incorporated, East Providence, R.I.

[21] Appl. No.: 786,787

[22] Filed: Nov. 1, 1991

[51] Int. Cl.⁵ .................. E05D 11/10; E05C 17/18
[52] U.S. Cl. .................................. 16/335; 292/267
[58] Field of Search ............... 16/332, 335, 364; 292/278, 267, 270

[56] References Cited
U.S. PATENT DOCUMENTS
714,177  11/1902  Harris ........................... 292/270

FOREIGN PATENT DOCUMENTS
2826002  12/1979  Fed. Rep. of Germany ...... 292/278

Primary Examiner—Robert L. Spruill
Assistant Examiner—Carmine Cuda
Attorney, Agent, or Firm—Salter, Michaelson & Benson

[57] ABSTRACT

A latching assembly for hingeably connected face-to-face plate members includes an automatic latching assembly for automatically latching said members in a predetermined angular relation to each other when one of the plates is swung away from the other and for automatically releasing and rendering said latching assembly inoperative in response to further opening movement of the members, whereby the members may be returned to their original face-to-face position.

5 Claims, 3 Drawing Sheets

LATCHING ASSEMBLY FOR HINGEABLE PLATE MEMBERS

BACKGROUND OF THE INVENTION

The instant invention relates to hingeable plate assemblies of the general type used for photolithographic processes and more particularly to a latching assembly for automatically latching the lid plate thereof in an open position.

Photolithographic processes have generally been found to be highly effective for use in forming relief patterns on various substrates, such as on printed circuit boards. In this regard, typical photolithographic processes are carried out by applying a mask image to a glass plate, and then overlaying the glass plate on a substrate which has been previously coated with a photosensitive material. The unmasked areas of the substrate are then exposed to actinic radiation in order to effect the desired reaction in the photosensitive material thereon. The glass plate is removed and the substrate is treated with a solvent developing process to produce the desired relief image on the substrate.

Similar processes have also been found to be effective for simultaneously applying images to both sides of a substrate utilizing a hingeable glass plate assembly comprising a pair of masked plates which are hingeably connected. A process of this type is carried out by positioning a substrate between a pair of glass plates having mask images thereon and simultaneously exposing both sides of the substrate which have been previously coated with a photosensitive material. Thereafter, both sides of the substrate are treated with the solvent developing process to produce the desired relief patterns thereon.

During repeated exposures of numerous substrates it has generally been found that repeated positioning of the substrates between the glass plates is an awkward procedure which requires that the lid plate be raised and manually held in an open position while the resident substrate is removed and a new substrate positioned. Manually holding the lid plate open ties up one of the operators hands while attempting to remove the resident substrate and reposition another with the other free hand. One solution to this problem which has been heretofore available is the provision of a swinging prop arm which holds the lid plate open while the substrate is replaced. However, the operator still has to manually position the prop arm before attempting to remove the substrate from the plate assembly and this has also been found to be an awkward procedure. In addition, it has been found that the prop arm can slip or become dislodged during substrate replacement and cause the lid plate to fall downward onto the operators hands. The heretofore available plate assemblies have thus been found to be inadequate in these regards.

SUMMARY OF THE INVENTION

The instant invention provides a latching assembly for a hingeable glass plate film carrier which automatically latches the lid plate thereof in an open position when it is raised and thereafter releases when the lid plate is further raised thereby freeing both hands of the user for positioning a substrate therein. Briefly, the invention preferably includes identical first and second latching assemblies, each of which comprise an elongated rod pivotally attached adjacent opposite edges of the bottom plate of the film carrier, a bearing block pivotally attached adjacent opposite edges of the lid plate, a resilient spring finger mounted on the block, and a tubular sleeve member. The sleeve is slidably received in a bore which extends through the block and a terminal end of the spring finger extends through an aperture in the wall of the sleeve. The rod is slidably received in the sleeve such that the rod slides through the sleeve and block when the lid is raised and lowered. The spring finger makes pressurized engagement with the rod through the sleeve aperture and the rod further has a notch therein adapted for receiving the terminal spring end. A retaining cap is mounted on the end of the rod.

The assembly is operative for automatically latching when the lid is raised because of the fact that the block and sleeve slide up the rod as a unit until the spring finger engages the notch therein through the sleeve aperture. Similarly, the assembly is operative for automatically releasing when the lid is raised further with the block and sleeve further sliding up the rod until the sleeve is blocked by the retaining cap at the end of the rod, at which point the block shifts relative to the sleeve until similarly blocked at which point the spring finger is no longer aligned with the sleeve aperture but rather is in pressurized engagement with the outer surface of the sleeve wall. Thereafter, when the lid is lowered, the pressurized engagement between the spring and the sleeve causes the latter to move down the rod, past the notch, until the sleeve is blocked by an abutment on the base of the rod, the block once again shifting relative to the sleeve until the latter is similarly blocked and the spring finger becomes once again aligned with the sleeve aperture whereupon it once again extends therethrough into engagement with the rod.

It is therefore an object of the present invention to provide an effective latching assembly for a hingeable glass plate film carrier which automatically latches the lid plate thereof in an open position thus freeing both hands of the user to position a substrate therein or to quickly and efficiently remove a resident substrate and replace it with another.

It is another object of the present invention to provide a latching assembly which can be released by further raising the lid plate.

Other objects, features and advantages of the invention shall become apparent as the description thereof proceeds when considered in connection with the accompanying illustrative drawings.

DESCRIPTION OF THE DRAWINGS

In the drawings which illustrate the best mode presently contemplated for carrying out the present invention.

DESCRIPTION OF THE INVENTION

Figure 1:
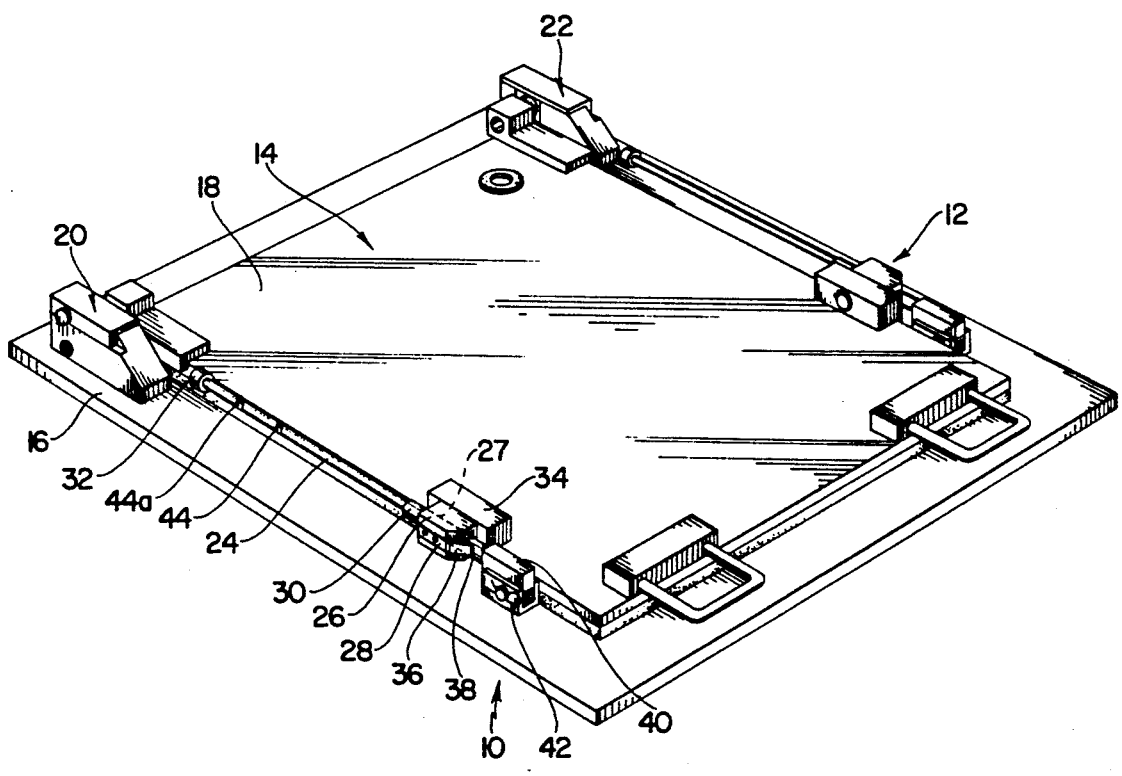
FIG. 1 is a perspective view of the hinged glass plate assembly embodying the latching assemblies of the present invention.

Referring now to the drawings, the latching assembly for a hingeable glass plate film carrier generally comprises identical first and second latching assemblies which are illustrated and generally indicated at 10 and 12 in FIG. 1.

The hingeable film carrier 14 preferably comprises substantially flat, generally rectangular bottom and lid plates 16 and 18 having side and end edges, the plates being pivotally interconnected by hinge assemblies 20 and 22. As illustrated in FIG. 1, the lid plate 18 is preferably formed in a somewhat smaller overall dimension than the bottom plate 16. Although it is preferred to use the latching assemblies at opposite edges of the plates for better stability, it is conceivable that only one latching assembly could be employed.

The first and second latching assemblies 10 and 12 are preferably formed as mirror images of each other and they each comprise an elongated rod 24 pivotally attached adjacent opposite side edges of the bottom plate 16, a bearing block 26 pivotally attached adjacent opposite side edges of the lid plate 18, said block 26 also being positioned adjacent the aforesaid side edges of the bottom plate, a spring finger 28 mounted on the block 26, a sleeve member 30 and a retainer cap 32.

Block 26 is preferably formed from a suitable metal, such as stainless steel, and is pivotally attached to a rectangular shaped abutment 34 carried adjacent the side edges of the top of lid 18. The abutment 34 is preferably formed from a suitable metal and preferably has a substantially flat bottom which is adapted to be secured to the lid plate 18 by any suitable means. Block 26 further has a bore 27 extending therethrough.

The spring finger 28 is preferably formed from a suitable resilient metal and is mounted by any suitable means on the surface of block 26 in parallel relation with the bore 27. The spring finger 28 has a terminal end 36 which is biased so as to overlie the end of bore 27.

The sleeve member 30 preferably comprises a tubular wall having an aperture 38 therein and is preferably formed from a suitable metal, such as copper. Sleeve 30 is slidably received in bore 27 of block 26 and terminal end 36 of spring finger 28 extends through aperture 38.

The rod 24 is preferably formed from a suitable metal, such as stainless steel, and has a base 40 which is pivotally attached to a support base 42. Support base 42 is also preferably formed from a suitable metal, such as stainless steel and preferably has a substantially flat bottom which is adapted to be secured to the bottom plate 16 by any suitable means. Rod 24 further has a notch 44 therein adjacent but somewhat spaced from the free end thereof. The rod 24 is slidably received in the sleeve 30 such that the rod slides through the sleeve and block when the lid is raised and lowered. Spring finger end 36 makes pressurized engagement with the rod 24 through the sleeve aperture 38.

The retaining cap 32 is preferably mounted on the end of the rod 24 and forms an abutment on the end thereof.

Figure 2:
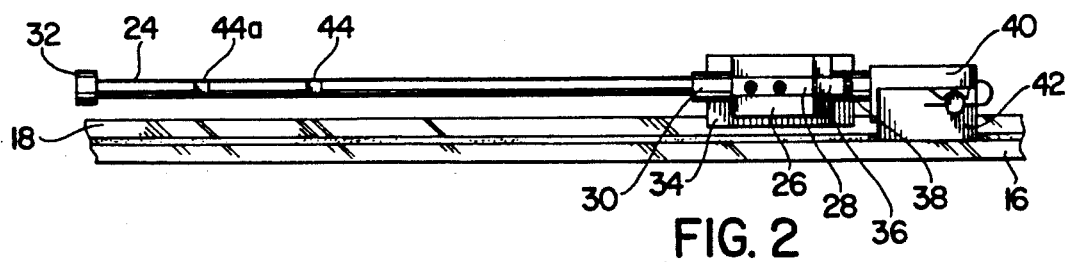
FIG. 2 is a side elevational view thereof showing one of the latching assemblies while the hinged glass plate assembly is in the closed position.
Figure 3:
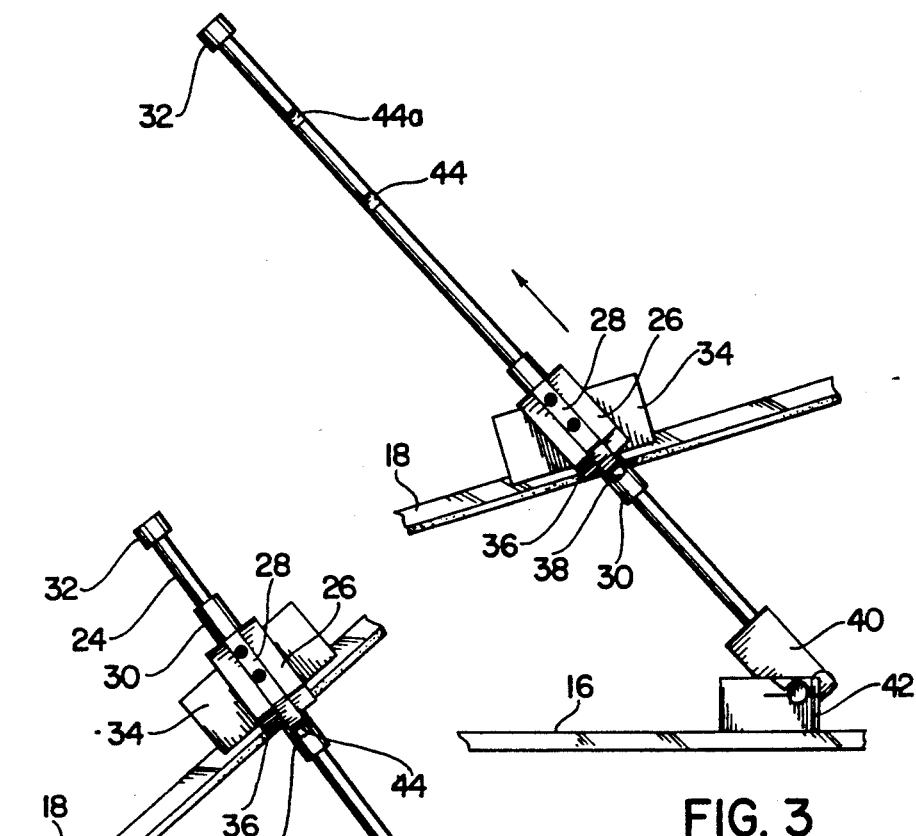
FIGS. 3 through 8 are similar views sequentially showing the latching assembly in various positions as the lid plate is raised, latched, released and then lowered.
Figure 4:

In FIGS. 2 through 8 latching assembly 10 is shown in its various sequential positions as the lid plate 18 is raised, latched, released and lowered. Referring now to FIGS. 2 through 4, the assembly is operative for automatically latching the lid plate 18 when it is raised to a desired angular position. The assembly 10 is shown in the closed position in FIG. 2. When the lid 18 is raised as in FIG. 3, the block 26 and sleeve 30, which move as a unit because of the inter-engagement between spring end 36 and sleeve aperture 38, slide up the rod 24 until the spring finger end 36 engages the notch 44 therein as seen in FIG. 4. The lid 18 is thereby automatically latched in the open position.

Although there is only one notch 44 illustrated on rod 24, any number of desired notches 44a can be utilized depending on the users preference. The introduction of additional notches does not affect the operation of the invention and allows the lid plate to be latched in a plurality of angularly disposed positions.

Figure 5:
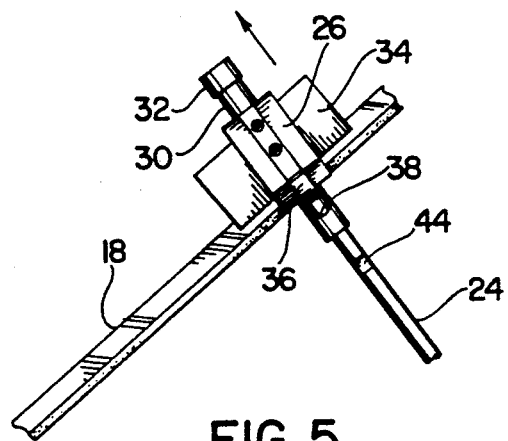
Figure 6:
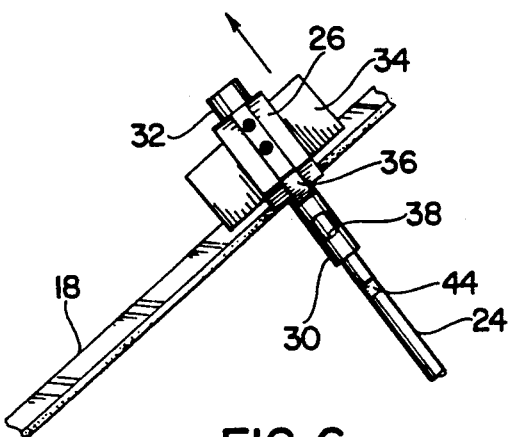
Figure 7:
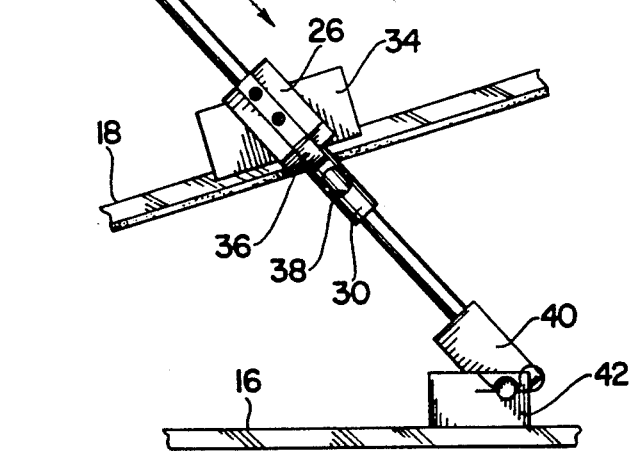
Figure 8:
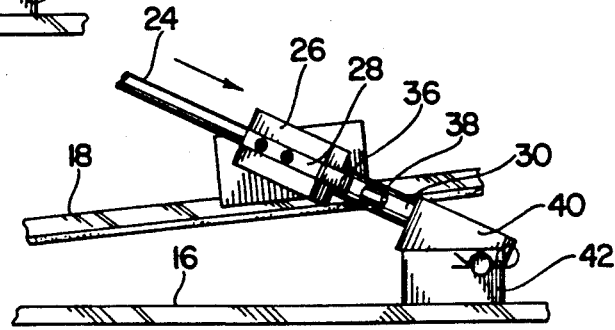

Referring now to FIGS. 5 and 6 the assembly 10 is similarly operative for releasing the lid 18. When the lid 18 is raised further, as in FIG. 5, spring end 36 moves out of the notch 44 and block 26 and sleeve 30 slide further up the rod 24 until the sleeve is blocked against further movement by the retaining cap 32. When the lid is even further raised as in FIG. 6, the block 26 slides relative to the sleeve 30 until similarly blocked by the retaining cap, at which point the spring finger end 36 has moved away from aperture 38 and into pressurized engagement with the wall of sleeve 30. When the lid 18 is thereafter lowered as in FIG. 7, the pressurized engagement between the spring finger end 36 and sleeve 30 cause the latter to move down the rod 24 and past the notch 44 without engagement of the spring finger end 36 therein as the latter rests on the wall of the sleeve 30. When the lid 18 is lowered even further as in FIG. 8, sleeve 30 is blocked against further movement by the base 40 of the rod 24, at which point block 26 shifts relative to the sleeve 30 until similarly blocked by the base 40, at which point the spring finger end 36 is again aligned with aperture 38 whereupon it extends therethrough into engagement with rod 24, thereby once again assuming the starting position of the parts as illustrated in FIG. 2.

It is pointed out that the first and second latching assemblies work in unison and simultaneously provide the same latching and releasing motions on opposing edges of the plate assembly, although as previously pointed out, it is conceivable that only one latching assembly could be used.

It is seen therefor that the instant invention provides an effective latching assembly for automatically latching the lid plate of a hingeable glass plate film carrier in an open position thus freeing both hands of the operator to replace the resident substrate easily and efficiently. It is also seen that the instant invention provides for easy and effective releasing of the latching assembly by further raising the lid plate. The latching assembly is specifically adapted so that both of the operators hands are free to remove a resident substrate and replace it with another and there is no longer a need to manually hold the lid plate and/or to manually manipulate the latching and release means. The latching assembly automatically latches the lid open when raised and similarly releases the lid when raised further. Hence, for these reasons it is believed that the instant invention represents a significant advancement in the latching assembly art.

While there is shown and described herein certain specific structure embodying the invention, it will be manifest to those skilled in the art that various modifications and rearrangements of the parts may be made without departing from the spirit and scope of the underlying inventive concept and that the same is not limited to the particular forms herein shown and described except insofar as indicated by the scope of the appended claims.

What is claimed is:

1. A latching assembly for hingeable plate members and the like comprising:

first and second generally rectangular plate members having side and end edges;

hinge means interconnecting adjacent ends of said plates whereby said second plate is moveable between a first position wherein said plates are disposed in overlying face-to-face relation and a second position wherein said second plate is angularly disposed with respect to said first plate;

an elongated rod pivotally attached to said first plate adjacent a side edge thereof;

a bearing block pivotally attached to said second plate adjacent a side edge thereof adjacent to the aforesaid side edge of said first plate, said block having a bore extending therethrough;

a sleeve member comprising a tubular wall slidably received within said bore, said wall having an aperture therein, said rod slidably received within said sleeve such that said rod slides through said sleeve and said block when said second plate is moved between said first and second positions;

a resilient spring finger mounted on said block having a terminal end extending through said sleeve aperture and making pressurized engagement with said rod;

a notch in said rod adapted to receive said terminal spring end when said second plate is moved to said second position to latch said plates in said second position; and means for shifting said sleeve relative to said block such that said spring end is forced out of alignment with said aperture and is received in pressurized engagement with said sleeve wall to permit closing movement of said second plate to said first position.

2. In the latching assembly of claim 1, said shifting means comprising:

a base and a free end on said rod;

a retainer cap mounted on said rod free end whereby when said second plate is moved to a greater angularly disposed position, said block and sleeve slide up said rod until said sleeve is blocked against further movement by said retainer cap, said block shifting relative to said sleeve until similarly blocked, said spring finger during said relative shifting being dislodged from said aperture into pressurized engagement with said sleeve wall, and when said second plate is thereafter moved to said first position, said pressurized engagement between said spring and said sleeve causes said sleeve to move down said rod, past said notch until blocked by said base, wherein said block shifts relative to said sleeve until similarly blocked, and said spring finger is again aligned with said aperture and reengages said rod therethrough.

3. In the latching assembly of claim 1, said rod further comprising a plurality of spaced notches operative for latching said plates in a plurality of angularly disposed positions.

4. In the latching assembly of claim 1, said second plate being formed in smaller overall dimensions than said first plate.

5. In the latching assembly of claim 1, said bearing block being pivotally mounted to an abutment carried adjacent the side edge of said second plate.

* * * * *